(12) United States Patent
Henderson

(10) Patent No.: US 6,426,647 B1
(45) Date of Patent: Jul. 30, 2002

(54) DUAL RAIL DRIVE FOR DISTRIBUTED LOGIC

(75) Inventor: Alex E. Henderson, Hillsborough, CA (US)

(73) Assignee: Fast-Chip, Inc., Sunnyvale, CA (US)

( * ) Notice: Subject to any disclaimer, the term of this patent is extended or adjusted under 35 U.S.C. 154(b) by 0 days.

(21) Appl. No.: 09/663,865

(22) Filed: Sep. 15, 2000

Related U.S. Application Data

(60) Provisional application No. 60/156,029, filed on Sep. 23, 1999.

(51) Int. Cl.[7] .......................... G06F 7/38; H03K 19/177
(52) U.S. Cl. ........................................ 326/39; 327/404
(58) Field of Search ............................... 326/38, 40, 83, 326/86, 112, 39; 327/404, 408

(56) References Cited

U.S. PATENT DOCUMENTS 5,021,684 A  *  6/1991  Ahuja et al. ................... 326/27

* cited by examiner

Primary Examiner—Michael Tokar
Assistant Examiner—Daniel D. Chang
(74) Attorney, Agent, or Firm—Fenwick & West LLP

(57) ABSTRACT

A logic circuit comprises a dual rail drive circuit having a first rail and a second rail. The logic circuit further comprises a logic block having a first input coupled to receive an input signal from the first rail of the dual rail driver, and a second input coupled to receive an input signal from the second rail of the dual rail driver. In one embodiment, the input signal from the first rail of the dual rail driver can swing to a voltage level sufficient to turn on a p-channel transistor, and the input signal from the second rail of the dual rail driver can swing to a voltage level sufficient to turn on an n-channel transistor. For example, for a 0.18 micron process the input signal from the first rail may have a voltage swing from VDD to VDD-400 MV, and the input signal from the second rail may a voltage swing from GROUND to 400 MV.

25 Claims, 7 Drawing Sheets

DUAL RAIL DRIVE FOR DISTRIBUTED LOGIC

RELATED APPLICATION

The subject matter of the present application is related to and claims priority, under 35 U.S.C. §119(e), from U.S. provisional patent application Ser. No. 60/156,029, entitled "Low Voltage Dual Rail Drive for Distributed Logic" by Alex E. Henderson, which application was filed on Sep. 23, 1999 and is incorporated herein by reference.

BACKGROUND

A. Technical Field

The present invention relates generally to driver circuits for a logic circuit, and more specifically to a dual rail driver circuit for a logic circuit.

B. Background of the Invention

Large arrays of logic circuits, such as content addressable memory devices (CAMs) typically share a common set of inputs driven by a driver circuit. Conventional logic circuitry for driver circuits typically employs singe rail inputs, i.e. a single input signal that represents either a logical zero or a logical one. For example, referring now to FIG. 1, there is shown a prior art logic circuit employing a single rail driver circuit. The logic circuit 100 comprises a plurality of logic blocks 102. Each logic block is coupled to a single rail driver circuit 104 and local inputs 106. The driver circuit 104 provides a common input signal to each of the logic blocks 102.

Referring now to FIGS. 2A and 2B, there are shown a prior art inverter and a prior art NAND gate respectively. Prior art inverter 200A comprises a p-channel transistor 204 and an n-channel transistor 206. The prior art inverter 200A further comprises a single input 202 to both the p-channel transistor 204 and the n-channel transistor 206. The prior art NAND gate 200B comprises two p-channel transistors, 208 and 210, and two n-channel transistors, 212 and 214. The prior art NAND gate 200B further comprises two inputs, 216 and 218. Input 216 provides a common input signal to both the p-channel transistor 208 and the n-channel transistor 212. Thus, the prior art inverter 200A and the prior art NAND gate 200B are each driven by a prior art single rail driver circuit (not shown) that provides a single input signal 202, 216 to both p-channel and n-channel transistors.

When a single rail driver circuit is used to drive a very large logic circuit, the input signal from the driver circuit may move very slowly from the threshold voltage for activating an n-channel transistor, for example, to the threshold voltage for activating a p-channel transistor. In such instances, there is typically a long period of time when both the p-channel transistors and the n-channel transistors in the logic circuit are on. One disadvantage of this setup is that a very high DC current runs through the logic circuit during that period. This spike in DC current results in a large power dissipation which is undesirable.

Accordingly it is desirable to provide a system and method for a driver circuit that uses a dual rail input for providing a common input to a logic circuit. It is also desirable to provide a driver circuit that provides a separate input signal for p-channel transistors and for n-channel transistors. Additionally, it is also desirable to provide a system and method for a driver circuit that decreases the power consumed by the logic circuit.

SUMMARY OF THE INVENTION

The present invention overcomes the deficiencies and limitations of the prior art with a unique system and method for a dual rail driver circuit for a logic circuit. A logic circuit in accordance with one embodiment of the present invention comprises a dual rail drive circuit having a first rail and a second rail. The logic circuit further comprises a first input coupled to receive an input signal from the first rail of the dual rail driver circuit, and a second input coupled to receive an input signal from the second rail of the dual rail driver circuit. In one embodiment, the input signal from the first rail of the dual rail driver circuit can swing to a voltage level sufficient to turn on a p-channel transistor, and the input signal from the second rail of the dual rail driver circuit can swing to a voltage level sufficient to turn on an n-channel transistor. For example, for a 0.18 micron process the input signal from the first rail may have a voltage swing from VDD to VDD-400 MV, and the input signal from the second rail may a voltage swing from ground to 400 MV.

In one aspect, the dual rail driver circuit comprises two rails, a plus rail and a minus rail. The dual rail circuit driver further comprises a plus rail voltage reference for generating a voltage appropriate for activating an n-channel transistor, and a plus rail driver, coupled to receive a signal from the plus rail voltage reference, for driving the voltage onto the plus rail. The dual rail driver circuit also comprises a minus rail voltage reference for generating a voltage appropriate for activating a p-channel transistor, and a minus rail driver, coupled to receive a signal from the minus rail voltage reference, for driving the voltage onto the minus rail.

These and other features and advantages of the present invention may be better understood by considering the following detailed description of preferred embodiments of the invention. In the course of this description, reference will be frequently made to the attached drawings.

DETAILED DESCRIPTION OF THE PREFERRED EMBODIMENTS

Figure 1:
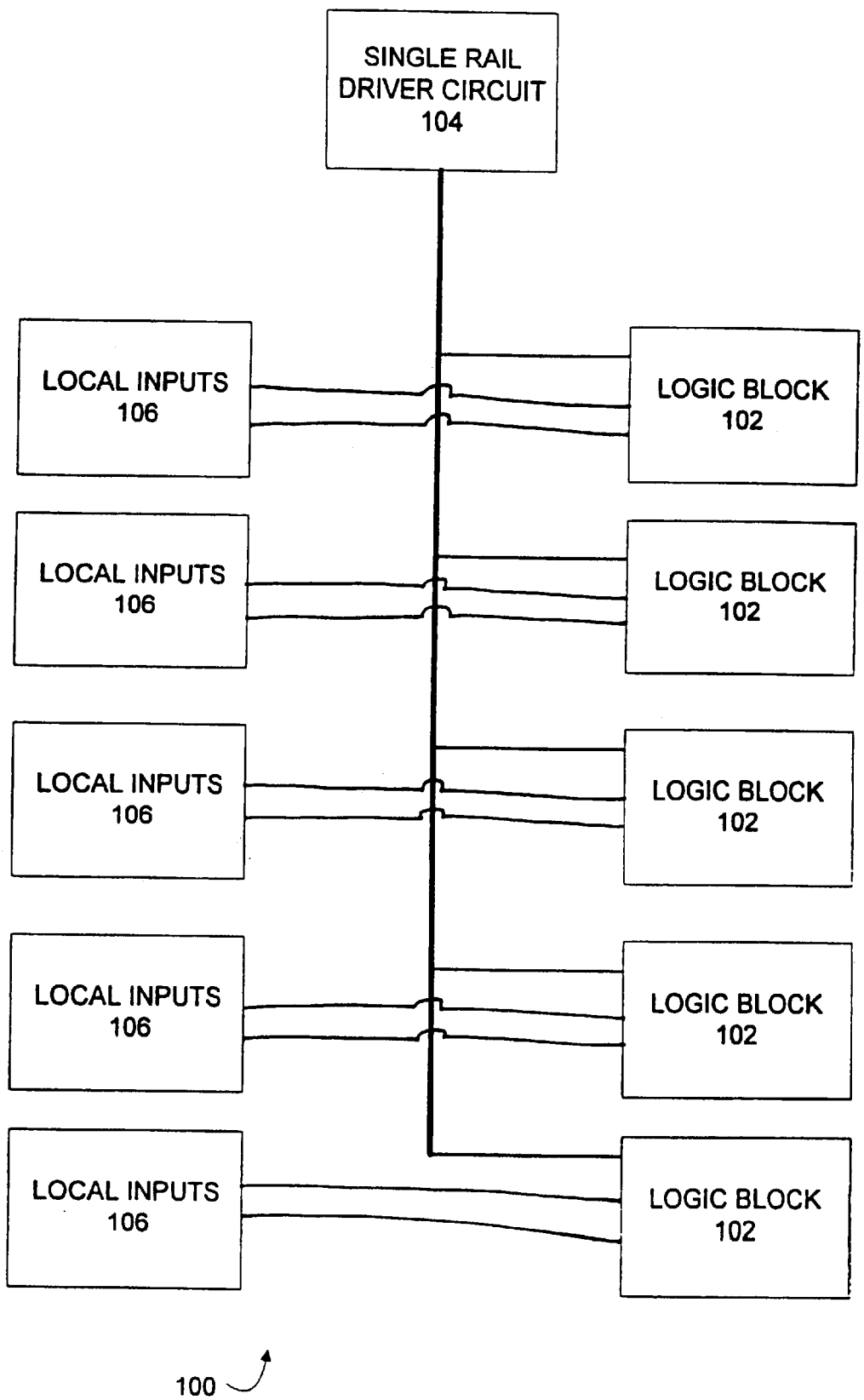
FIG. 1 is a block diagram of a prior art driver circuit for a logic circuit.
Figure 2A:
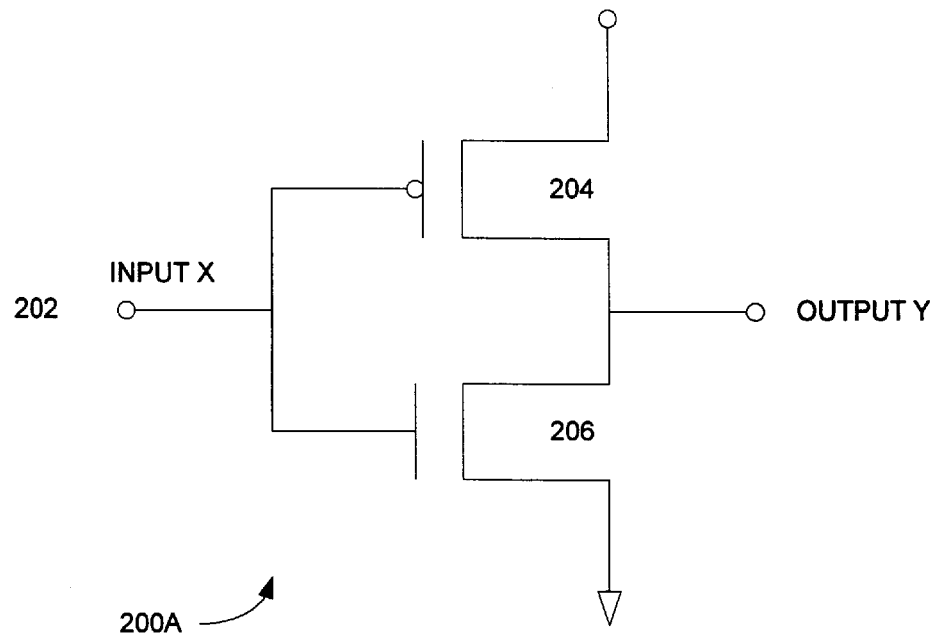
FIGS. 2A and 2B are block diagrams of a prior art inverter and a prior art NAND gate respectively with a single rail input.
Figure 2B:
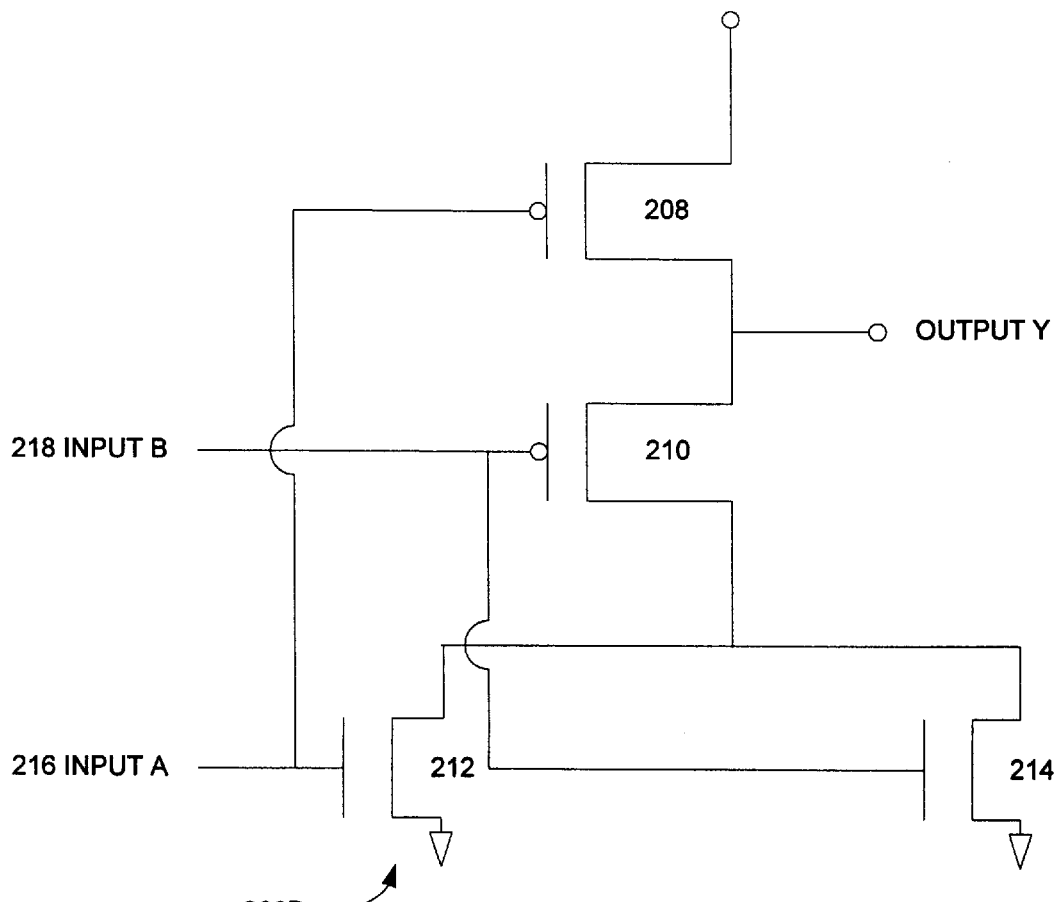
Figure 3:
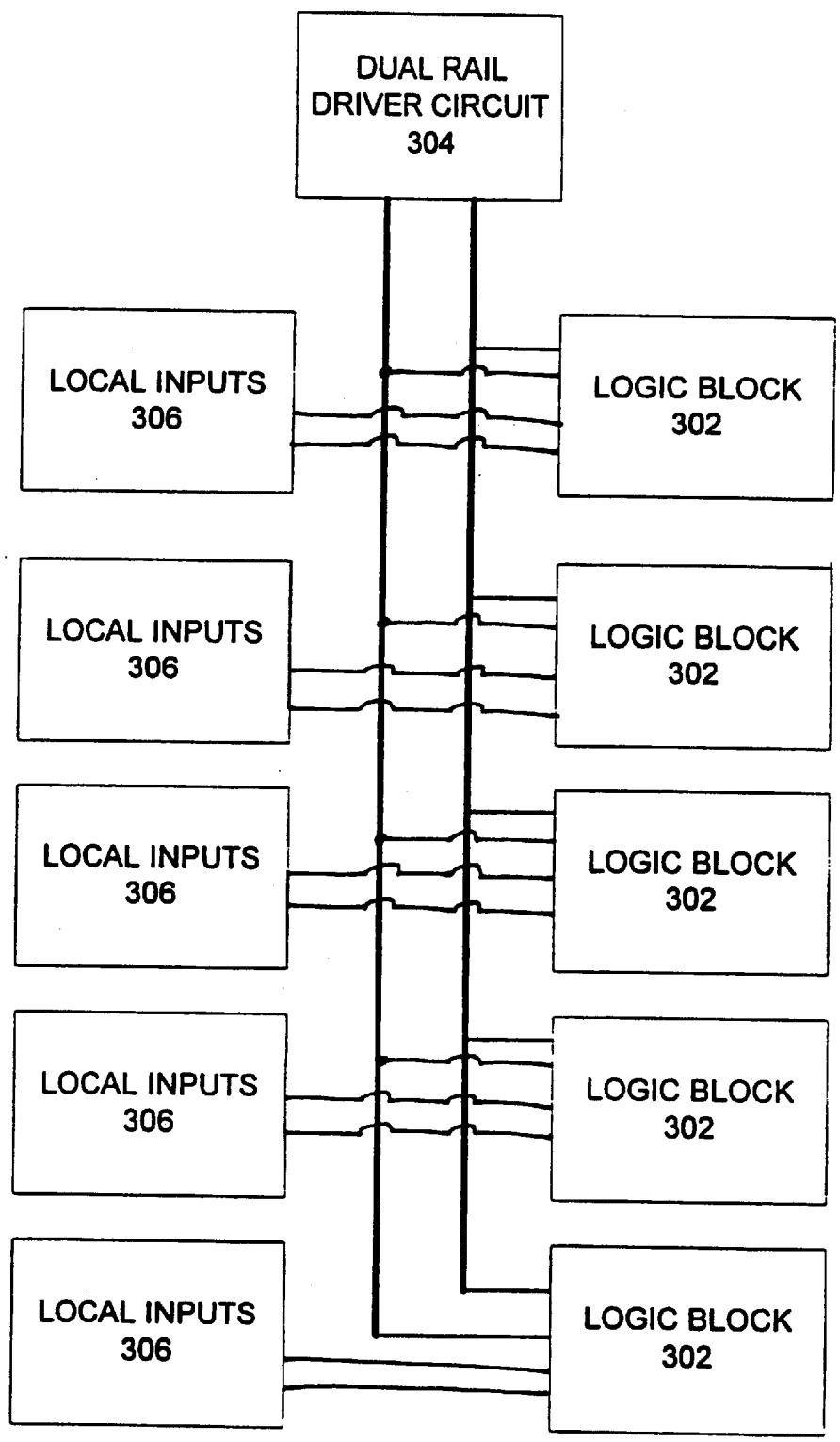
FIG. 3 is a block diagram of a logic system comprising a dual rail driver circuit in accordance with the present invention.

Referring now to FIG. 3, there is shown one embodiment of a logic circuit 300 comprising a dual rail driver circuit 304 in accordance with the present invention. The logic circuit comprises a plurality of logic blocks 302. Each logic block 302 comprises a logic circuit comprising a plurality of logic gates. As one skilled in the art will realize, the present invention is not limited to any particular logic circuit or logic gates in the logic block 302 but may be utilized with any logic circuit or gate requiring common inputs. Each logic block 302 is coupled to the dual rail driver circuit 304. The dual rail driver circuit 304 provides two commons inputs to each logic block 302: one input for p-channel transistors in the logic block 302 and one input for n-channel transistors in the logic block 302. The logic blocks 302 may also be coupled to local inputs 306. Thus, the present invention advantageously provides two input signals to each logic block: a first signal for activating p-channel transistors, and a second signal for activating n-channel transistors.

Figure 4:
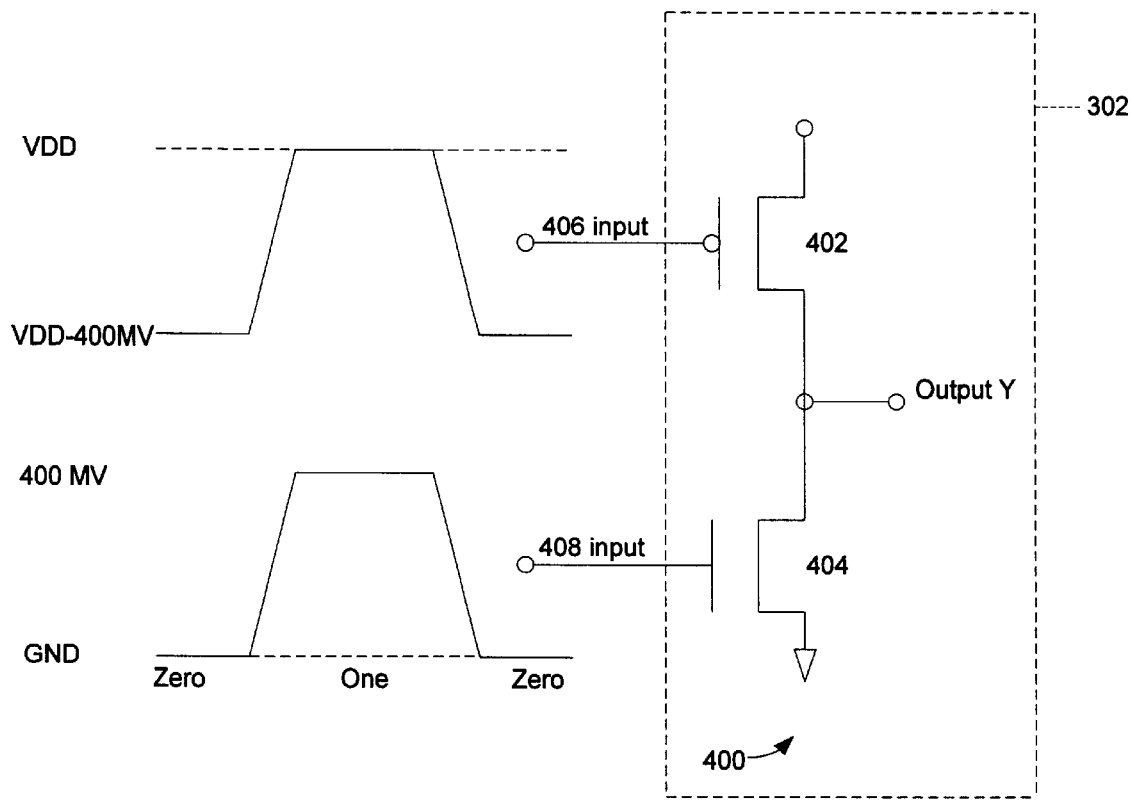
FIG. 4 is a block diagram of an inverter comprising a dual rail driver input in accordance with the present invention.

Referring now to FIG. 4, there is shown a block diagram of an inverter comprising inputs for receiving signals from a dual rail driver circuit (not shown) in accordance with one embodiment of the present invention. The inverter 400 comprises a p-channel transistor 402 and an n-channel transistor 404. The p-channel transistor 402 is coupled to receive an input 406 from one rail of the dual rail driver circuit, and the n-channel transistor 404 is coupled to receive an input 408 from a second rail of the dual rail driver circuit. FIG. 4 also illustrates one embodiment of the voltage swing of the inputs to the p-channel transistor and n-channel transistor respectively. The voltage level of the p-channel input 406 swings from a voltage equal to the supply voltage of the circuit to the threshold voltage for the p-channel transistor 402 or just below the threshold voltage for the p-channel transistor 402. For a 0.18 micron process where the threshold voltage for a CMOS transistor is on the order of 400 mV, this voltage swing may be from VDD to VDD-400 mV. Similarly, the voltage level of the n-channel transistor input 408 may swing from ground to the threshold voltage for the n-channel transistor 404 or to just above the threshold voltage for the n-channel transistor 404. For a 0.18 micron process where the threshold voltage for a CMOS transistor is on the order of 400 mV, this voltage swing may be from ground to 400 mV. Thus, the present invention provides a dual rail driver circuit that provides separate inputs for p-channel transistors and for n-channel transistors. As a result, each input from the dual rail driver circuit requires a much smaller voltage swing to turn on its respective transistor, thereby reducing the power dissipation for the logic circuit. In other words, whereas a single rail driver circuit has one input which swings from ground to VDD, a dual rail driver circuit has two inputs each having a much smaller voltage swing due to the fact that each rail is driving only one type of transistor. One skilled in the art will realize that the present invention is not limited to any specific voltage swing used by either rail for activating transisters, but that the principles of the present invention apply to any voltage swing used by the two rails of the dual rail driver circuit. The voltage swings of each rail may vary due to design or power considerations.

Figure 5:
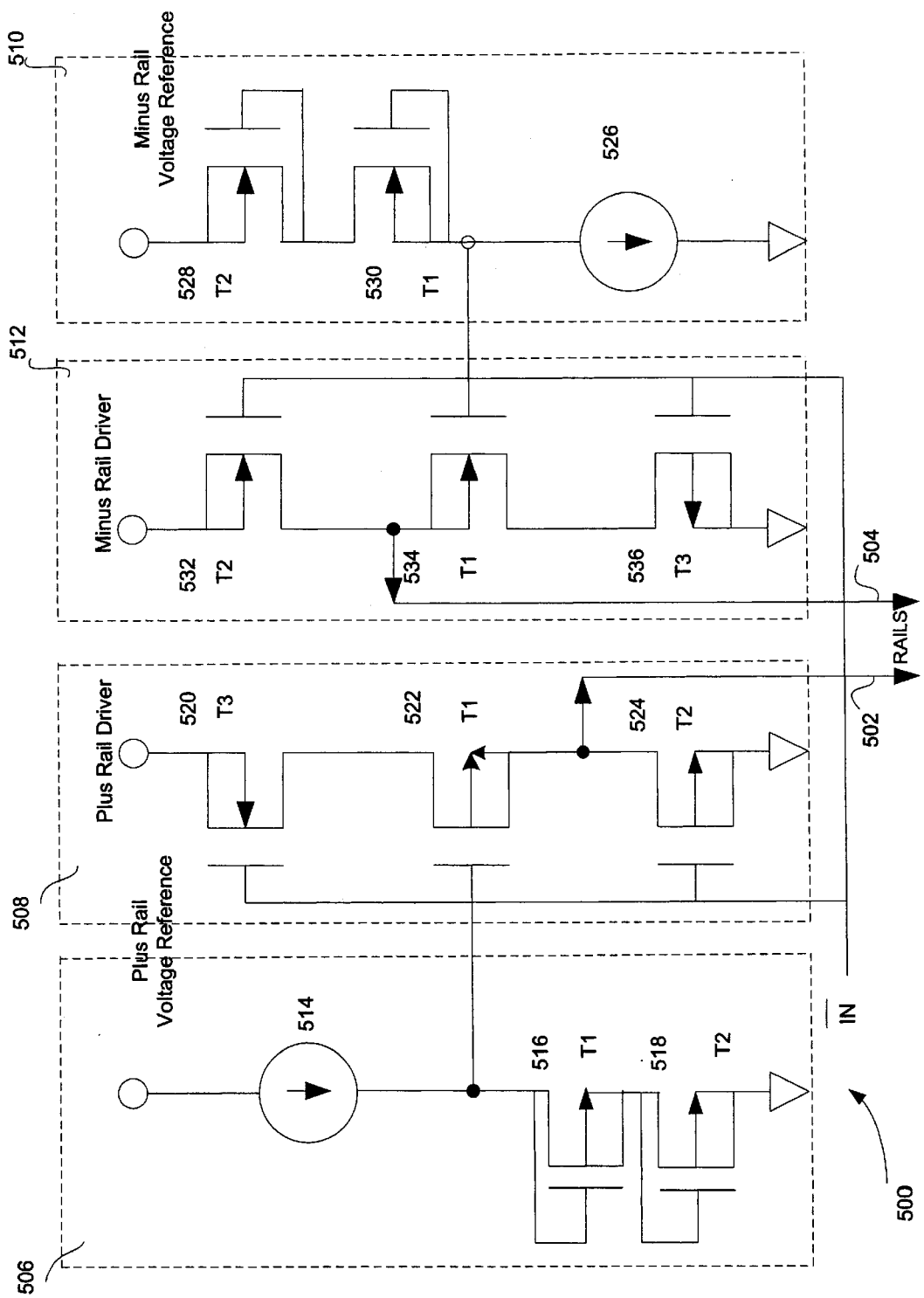
FIG. 5 is a block diagram of one embodiment of a dual rail driver circuit in accordance with the present invention.

Referring now to FIG. 5, there is shown one embodiment of a dual rail driver circuit in accordance with the present invention. The dual rail driver circuit 500 comprises two rails, a plus rail 502 for driving n-channel transistors and a minus rail 504 for driving p-channel transistors. The dual rail driver circuit 500 further comprises a plus rail voltage reference 506 and a plus rail driver for providing to the plus rail 502 the voltage required to turn on and off the n-channel transistors coupled to the plus rail 502. The dual rail driver circuit 500 further comprises a minus rail voltage reference 510 and a minus rail driver 512 for providing to the. minus rail 504 the voltage required to turn on and off the p-channel transistors coupled to the minus rail 504.

The plus rail voltage reference 506 comprises a current source 514 and two n-channel transistors, 516 and 518, coupled essentially as diodes to generate a reference voltage that is basically twice the threshold voltage for n-channel transistor. The plus rail driver 508 comprises a p-channel transistor 520 coupled to two n-channel transistors, 522 and 524. The minus rail voltage reference 510 comprises a current source 526 and two p-channel transistors, 528 and 530, coupled essentially as diodes to generate a reference voltage that is basically twice the threshold voltage for a p-channel transistor. The minus rail driver 512 comprises two p-channel transistors, 532 and 534, and an n-channel transistor 536. Thus, the driver circuit 500 may be designed to provide a voltage somewhat beyond the actual voltage required to turn on the p-channel or n-channel transistor to ensure that the transistors are completely turned on. One skilled in the art will realize that the present invention is not limited to this particular circuit design but may use any circuit design capable of producing a voltage swing on a first rail capable of turning on and off an n-channel transistor and a voltage swing on a second rail capable of turning on and off a p-channel transistor.

Figure 6:
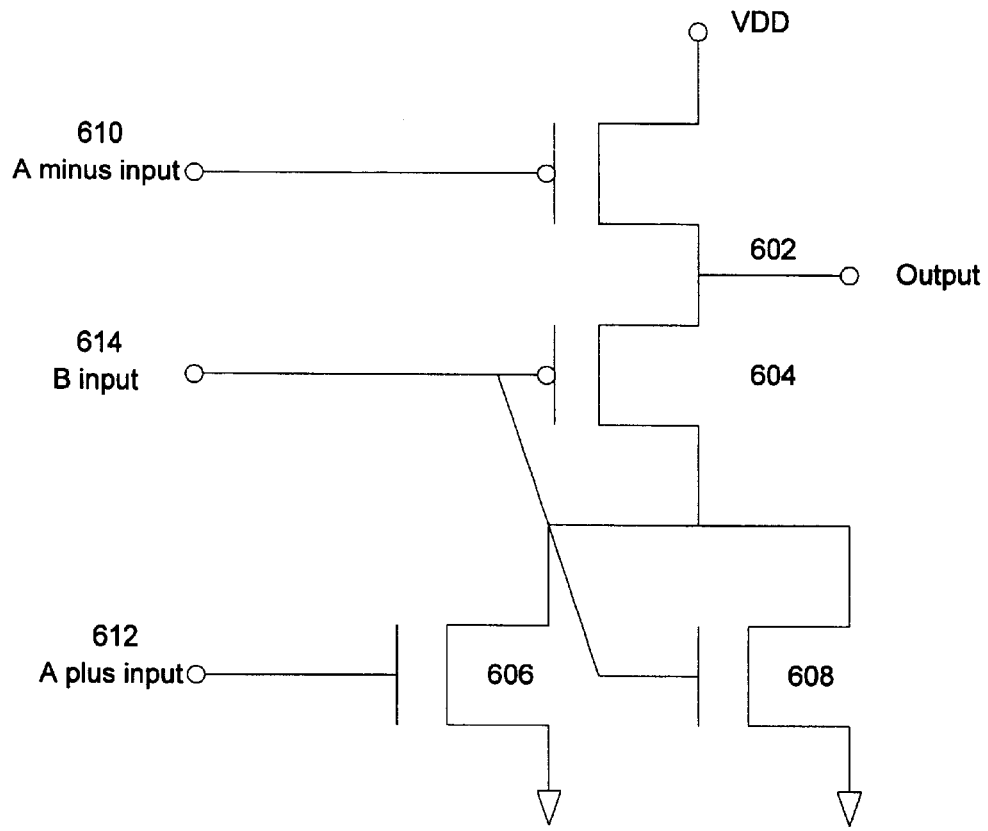
FIG. 6 is a block diagram of one embodiment of a NAND gate comprising inputs coupled to a dual rail driver circuit in accordance with the present invention.
Figure 7:
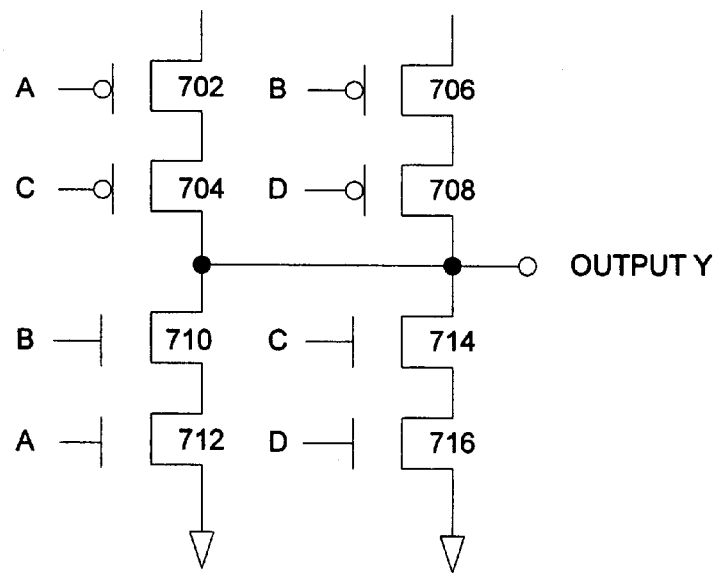
FIG. 7 is a block diagram of one embodiment of a complex logic circuit comprising inputs coupled to a dual rail driver circuit in accordance with the present invention.

As discussed above, the present invention may be used to drive any logic circuit or combination of logic gates. FIGS. 6 and 7 are examples of embodiments of a NAND gate and a complex logic gate respectively that are coupled to a dual rail driver circuit. Referring now to FIG. 6, there is shown a schematic of a NAND gate comprising two p-channel transistors, 602 and 604, and two n-channel transistors, 606 and 608. The NAND gate comprises two inputs, A and B. For the A input, the input 610 of p-channel transistor 602 is coupled to the minus rail of the dual rail driver circuit (not shown) and the input 612 of the n-channel transistor 606 is coupled to the plus rail of the dual rail driver circuit (not shown). In a preferred embodiment, the minus rail for activating a p-channel transistor is coupled to the p-channel transistor that is closest to the power supply, VDD, and the plus rail for activating an n-channel transistor is coupled to the transistor closest to ground. One skilled in the art will realize that the present invention does not require that any specific transistor be coupled to the plus or minus rail but that the design considerations may vary and dictate which transistors are coupled to which rail.

Referring now to FIG. 7, there is shown a schematic of a complex logic gate (an AND OR Inverter) comprising 4 p-channel transistors, 702, 704, 706, and 708, and 4 n-channel transistors, 710, 712, 714, and 716. In a preferred embodiment, transistor 702 is coupled to receive an input signal from the minus rail of a dual rail driver circuit (not shown) and transistor 712 is coupled to receive an input signal from the plus rail of the same dual rail driver circuit. Again, one skilled in the art will realize that the present invention does not require that any specific transistor be coupled to the plus or minus rail but that the dual rail driver circuit may be coupled to any set of inputs of the complex gate.

Figure 8:
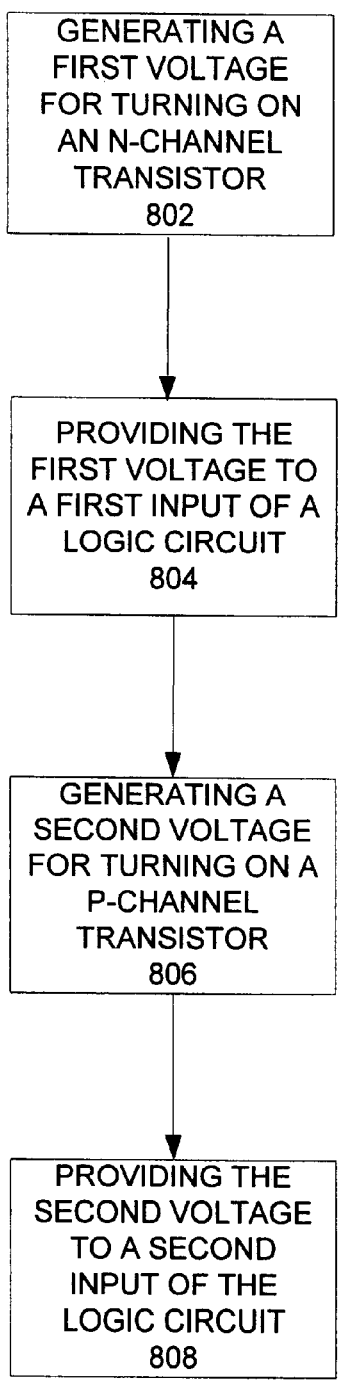
FIG. 8 is a block diagram of one embodiment of a method for providing a dual rail input signal to a logic circuit.

Referring now to FIG. 8, there is shown a block diagram of one embodiment of a method for providing a dual rail input to a logic circuit. The method first generates 802 a first voltage for turning on an n-channel transistor and then provides 804 the first voltage to a first input of the logic circuit. The method then generates 806 a second voltage for turning on a p-channel transistor and then provides 808 the second voltage to a second input of the logic circuit. In one embodiment, the first voltage is equal to the threshold voltage required for turning on an n-channel transistor. In another embodiment, the first voltage is greater than the threshold voltage for turning on an n-channel transistor to ensure that the n-channel transistor is completely turned on. In one embodiment, the second voltage is equal to the threshold voltage required for turning on a p-channel transistor. In yet another embodiment, the second voltage is greater than the threshold voltage required for turning on a p-channel transistor to ensure that the p-channel transistor is completely turned on.

From the above description, it will be apparent that the invention disclosed herein provides a novel and advantageous dual rail driver circuit for a logic circuit. The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

What is claimed is:

1. A logic circuit comprising:
   a dual rail driver circuit, the dual rail driver circuit having a first rail and a second rail;
   a first input to a logic block, the first input coupled to receive a first input signal from the first rail of the dual rail driver, wherein a voltage swing of the first input signal is limited to a minimum voltage level sufficient to turn on a p-channel transistor; and
   a second input to the logic block, the second input coupled to receive a second input signal from the second rail of the dual rail driver, wherein a voltage swing of the second input signal is limited to a minimum voltage level sufficient to turn on an n-channel transistor.

2. The logic circuit of claim 1 wherein the first input signal has a voltage swing from VDD to VDD-400 MV and wherein the second input signal has a voltage swing from GROUND to 400 MV.

3. The logic circuit of claim 1 wherein the logic block comprises an inverter comprising a first transistor and a second transistor, the first transistor being coupled to the first input and the second transistor being coupled to the second input.

4. The logic circuit of claim 1 wherein the logic block is a logic gate comprising a plurality of transistors, the plurality of transistors including at least one p-channel transistor and at least one n-channel transistor, and wherein the at least one p-channel transistor is coupled to the first input and the at least one n-channel transistor is coupled to the second input.

5. The logic circuit of claim 1 wherein the logic block comprises a plurality of logic blocks, each logic block being coupled to the first rail and the second rail of the dual rail driver circuit.

6. The system of claim 1, wherein the n-channel transistor is connected to a ground reference.

7. The system of claim 1, wherein the p-channel transistor is connected to a positive supply voltage.

8. A dual rail driver circuit comprising:
   a plus rail voltage reference for generating a first voltage;
   a plus rail driver, coupled to receive a first signal from the plus rail voltage reference, for driving the first voltage onto a first input to a logic block, wherein a voltage swing of the plus rail driver is limited to a minimum voltage level sufficient to turn on an n-channel transistor;
   a minus rail voltage reference for generating a second voltage; and
   a minus rail driver, coupled to receive a second signal from the minus rail voltage reference, for driving the second voltage onto a second input to the logic block, wherein a voltage swing of the minus rail driver is limited to a minimum voltage level sufficient to turn on a p-channel transistor.

9. The dual rail driver circuit of claim 8 wherein the plus rail driver has a voltage swing from GROUND to 400 MV and the minus rail driver has a voltage swing from VDD to VDD-400 MV.

10. The dual rail driver circuit of claim 8 wherein the logic block comprises an inverter.

11. The dual rail driver circuit of claim 8 wherein the logic block comprises a logic gate, the logic gate comprising a plurality of transistors including at least one p-channel transistor and at least one n-channel transistor, and wherein the first input to the logic block is coupled to the at least one n-channel transistor and the second input to the logic block is coupled to the at least one p-channel transistor.

12. The dual rail driver of claim 8 wherein the logic block comprises a plurality of similar logic blocks.

13. The system of claim 8, wherein the plus rail driver further comprises an n-channel transistor, and wherein the plus rail voltage reference further comprises a first transistor and a second transistor coupled to generate the first voltage that is twice a threshold voltage for the n-channel transistor.

14. The system of claim 8, wherein the minus rail driver further comprises a p-channel transistor, and wherein the minus rail voltage reference further comprises a first transistor and a second transistor coupled to generate the second voltage that is twice a threshold voltage for the p-channel transistor.

15. The system of claim 8, wherein the n-channel transistor is connected to a ground reference.

16. The system of claim 8, wherein the p-channel transistor is connected to a positive supply voltage.

17. A method for providing a dual rail driver input to a logic circuit, the logic circuit comprising a first input and a second input, the method comprising:
   providing a plus rail voltage signal to the first input, wherein a voltage swing of the plus rail voltage signal is limited to a minimum voltage level sufficient to turn on an n-channel transistor; and
   providing a minus rail voltage signal to the second input, wherein a voltage swing of the minus rail voltage signal is limited to a minimum voltage level sufficient to turn on a p-channel transistor.

18. The method of claim 17 wherein the plus rail voltage signal has a voltage swing from GROUND to 400 MV and the minus rail voltage signal has a voltage swing from VDD to VDD-400 MV.

19. The method of claim 17 wherein the first input is coupled to a p-channel transistor.

20. The method of claim 17 wherein the second input is coupled to an n-channel transistor.

21. The method of claim 17 wherein the logic circuit is an inverter.

22. The method of claim 17 wherein the logic circuit is a complex logic gate.

23. The system of claim 17, wherein the n-channel transistor is connected to a ground reference.

24. The system of claim 17, wherein the p-channel transistor is connected to a positive supply voltage.

25. A method for providing a dual rail driver input to a logic circuit, the logic circuit comprising a first input and a second input, the method comprising:

providing a plus rail voltage reference;

driving the plus rail voltage reference onto a first input to a logic block, wherein a voltage swing of the plus rail voltage reference is limited to a minimum voltage level sufficient to turn on an n-channel transistor;

providing a minus rail voltage reference; and driving the minus rail voltage reference onto a second input to the logic block, wherein a voltage swing of the minus rail voltage reference is limited to a minimum voltage level sufficient to turn on a p-channel transistor.

* * * * *